United States Patent
Yamanaka

(10) Patent No.: US 8,807,616 B2
(45) Date of Patent: Aug. 19, 2014

(54) ROBOT HAND

(71) Applicant: Disco Corporation, Tokyo (JP)

(72) Inventor: Satoshi Yamanaka, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/917,360

(22) Filed: Jun. 13, 2013

(65) Prior Publication Data

US 2013/0341946 A1    Dec. 26, 2013

(30) Foreign Application Priority Data

Jun. 20, 2012 (JP) .................. 2012-138592

(51) Int. Cl.
*B66F 19/00* (2006.01)
*B25J 15/00* (2006.01)

(52) U.S. Cl.
CPC ............ B25J 15/008 (2013.01); *Y10S 414/137* (2013.01)
USPC ........ 294/213; 414/217; 414/744.5; 414/937; 414/416.03; 414/416.08

(58) Field of Classification Search
CPC ............ Y10S 294/902; Y10S 414/141; Y10S 414/135; Y10S 414/137; Y10S 901/23; H01L 21/68707; H01L 21/67742; B66C 1/48; B65G 47/90; B25J 15/008; B25J 18/00; B25J 9/104; B25J 18/06; B25J 15/0009; B25J 9/1697; B25J 9/042; A61B 19/2203
USPC ......... 294/213, 103.1, 902, 119.1; 414/744.5, 414/744.6, 744.8, 935, 937, 941, 217, 414/217.1, 416.03, 416.08, 938; 74/490.03, 74/490.04; 901/8, 15, 28, 30–31, 36, 38, 901/47

See application file for complete search history.

(56) References Cited

U.S. PATENT DOCUMENTS

| | | | | |
|---|---|---|---|---|
| 5,810,935 A | * | 9/1998 | Lee et al. ...................... | 118/728 |
| 6,283,701 B1 | * | 9/2001 | Sundar et al. .............. | 414/744.5 |
| 6,752,442 B2 | * | 6/2004 | McNurlin et al. ............ | 294/106 |
| 7,661,921 B2 | * | 2/2010 | Kim et al. ................. | 414/744.5 |
| 2002/0071756 A1 | * | 6/2002 | Gonzalez ..................... | 414/941 |

FOREIGN PATENT DOCUMENTS

| | | |
|---|---|---|
| JP | 2011-035281 | 2/2011 |
| JP | 2011-131284 | 7/2011 |

* cited by examiner

*Primary Examiner* — Stephen Vu
(74) *Attorney, Agent, or Firm* — Greer Burns & Crain, Ltd.

(57) ABSTRACT

A robot hand includes a mounting surface to which a work unit is mounted with some freedom of horizontal movement. A pair of anti-fall hooks is formed at a tip portion of the mounting surface to support a front edge portion of the work unit so as to prevent the work unit from falling off the mounting surface. A pair of support section is provided at a rear edge portion of the mounting surface to support a rear edge portion of the work unit. If, during placement of the work unit into a cassette, the work unit collides with the cassette, the work unit comes into contact with one of the support sections, and the work unit is rotated on the mounting surface about the contact point as a fulcrum so as to correct the misalignment of the work unit.

2 Claims, 5 Drawing Sheets

ROBOT HAND

BACKGROUND OF THE INVENTION

1. Field of the Invention

The present invention relates to a robot hand for transporting a work unit that includes a plate-shaped work supported by an annular frame via an adhesive tape.

2. Description of the Related Art

When a plate-shaped work is processed by a processor, an adhesive tape is affixed to one side of an annular frame whose central portion is open first. Then, the plate-shaped work is affixed to an adhesive side of the adhesive tape exposed from the opening portion of the annular frame, thus forming a work unit. A processor for processing a plate-shaped work making up such a work unit includes at least a cassette, robot hand, temporary storage table, processing table, processing means and cleaning means. The cassette accommodates the work unit. The robot hand unloads the work unit from and loads it onto the cassette. The temporary storage table temporarily stores the work unit. The processing table holds the work unit. The processing means processes the work unit held by the processing table. The cleaning means cleans the processed work unit.

A conventional robot hand 10 shown in FIG. 5 has a mounting surface 11 whose tip side branches into two parts and to which a work unit is mounted. An anti-fall hook 12 having a surface more elevated than the mounting surface 11 is formed at each tip portion of the mounting surface 11, thus preventing the work unit from falling off the mounting surface 11. Further, a stepped portion 13 having a surface more elevated than the mounting surface 11 is formed at a rear side of the mounting surface 11, thus limiting an extent of misalignment of the work unit mounted to the mounting surface 11. In order to facilitate the mounting of the work unit to the above-described mounting surface 11 of the robot hand 10, the mounting surface 11 is formed larger than the diameter of the work unit. As a result, the work unit can move more or less in a horizontal direction parallel to the mounting surface 11 when mounted to the mounting surface 11.

The conventional robot hand configured as described above can, for example, extract the work unit from the cassette and transport it to the temporary storage table before transporting it to the processing table. Further, after the plate-shaped work making up the work unit is processed by the processor, the robot hand can transfer the work unit from the processing table to the cleaning table. Further, the robot hand can unload the work unit that has been cleaned and dried on the cleaning table from the cleaning table and store it in the cassette (refer, for example, to Japanese Patent Laid-Open Nos. 2011-035281 and 2011-131284).

SUMMARY OF THE INVENTION

However, the work unit mounted to the mounting surface of the robot hand may be misaligned in a direction of rotation of the work unit about its center in some cases. If the robot hand attempts to place the work unit into the cassette in this condition, an outer perimeter portion of the work unit comes into contact with an inner wall of the cassette, thus making it impossible to place the work unit into the cassette.

In light of the foregoing, it is an object of the present invention to provide a robot hand that can place a work unit into a cassette even if an outer perimeter portion of the work unit comes into contact with an inner wall of the cassette.

In accordance with an aspect of the present invention, there is provided a robot hand that is fitted to an arm of a robot for placing a work unit into a cassette. The work unit includes an annular frame, an adhesive tape and a plate-shaped work. The annular frame has an opening portion, a pair of first positioning surfaces extending parallel to each other with the opening portion sandwiched therebetween, and a pair of second positioning surfaces extending parallel to each other in a direction orthogonal to the first positioning surfaces with the opening portion sandwiched therebetween. An outer perimeter portion of the adhesive tape is affixed to the annular frame. The plate-shaped work is affixed to the adhesive tape. The robot hand includes a mounting surface, a pair of anti-fall hooks and a pair of support sections. The work unit is mounted to the mounting surface with some freedom of horizontal movement allowed for the work unit. Each of the anti-fall hooks is formed at one edge portion of the mounting surface to support a front edge portion of the work unit mounted to the mounting surface, thus preventing the work unit from falling off the mounting surface. Each of the support sections is provided at an other edge portion of the mounting surface opposite to the anti-fall hooks to support a rear edge portion of the work unit. If the annular frame collides with the cassette when the robot is activated to place the work unit, mounted to the mounting surface of the robot hand, into the cassette, the robot hand permits the rear edge portion of the work unit to come into contact with one of the support sections, thus allowing the work unit to be rotated on the mounting surface about the support section in contact with the rear edge portion as a fulcrum and allowing the work unit to be placed into the cassette.

The robot hand according to the present invention includes the pair of anti-fall hooks and the pair of support sections. The anti-fall hooks support the front edge portion of the work unit mounted to the mounting surface, thus preventing the work unit from falling off the mounting surface. The support sections are provided near a fitting section adapted to fit the robot hand to the arm of the robot, thus supporting the rear edge portion of the work unit. This makes it possible, if the outer perimeter portion of the work unit mounted to the mounting surface collides with the cassette during placement of the work unit into the cassette, to bring the support section into contact with the rear edge portion of the work unit and rotate the work unit on the mounting surface about the contact point as a fulcrum. As a result, the positional misalignment of the work unit is corrected on the mounting surface of the robot hand. This ensures positive placement of the work unit into the cassette even if the outer perimeter portion of the work unit is in contact with an inner wall of the cassette.

Further, the pair of support sections are provided near the fitting section. This makes it possible for one of the support sections, i.e., the one appropriate for the positional misalignment of the work unit on the mounting surface, to support the rear edge portion of the work unit, thus allowing the work unit to be rotated on the mounting surface about the point where the same unit is supported by the support section as a fulcrum.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
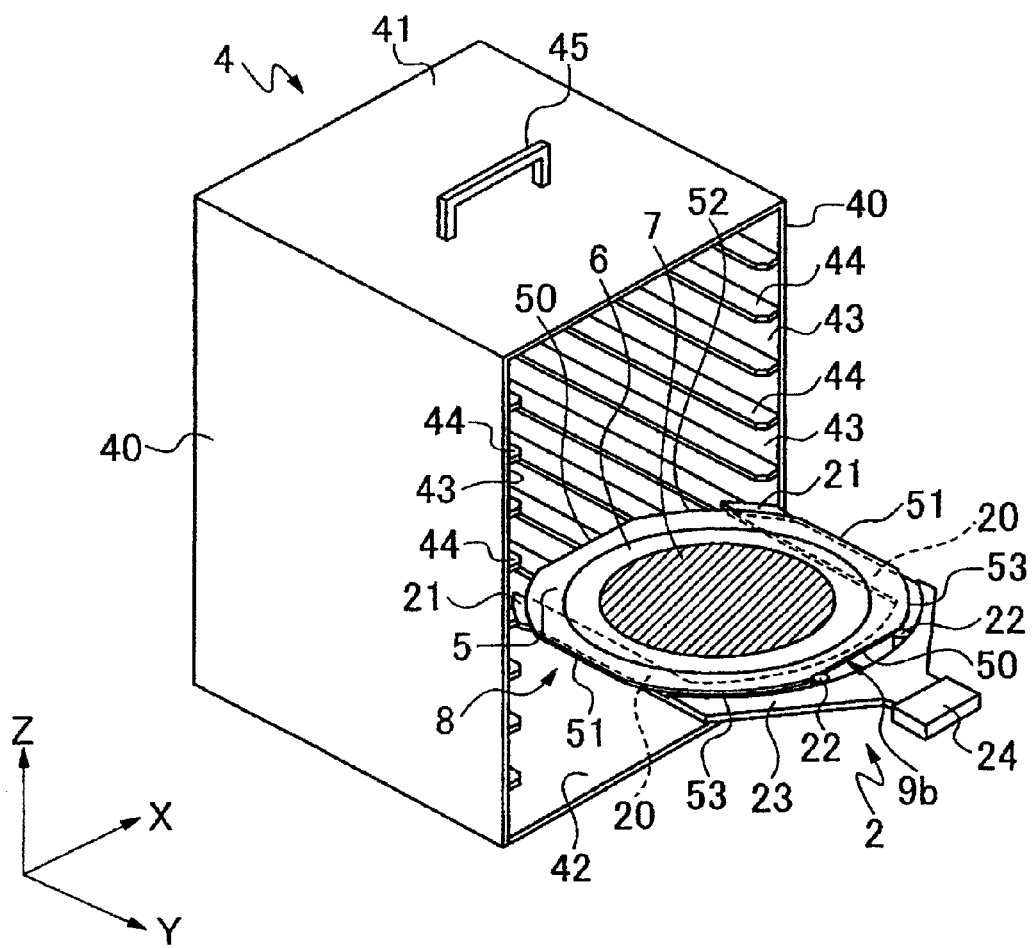
FIG. 1 is a perspective view illustrating a robot hand holding a work unit and a cassette.

A cassette 4 shown in FIG. 1 can accommodate a plurality of workpieces to be worked on such as plate-shaped works. The cassette 4 is formed in the shape of a box with a pair of side plates 40 that are installed upright in a z-axis direction, a top plate 41 connected to upper edge portions of the pair of side plates 40, and a bottom plate 42 connected to lower edge portions of the pair of side plates 40. A plurality of pairs of accommodating sections 44 are provided on inner walls 43 of the pair of side plates 40. The accommodating sections 44 are provided at predetermined spacings in the z-axis direction and protrude in a horizontal direction. Further, a grip 45 adapted to transport the cassette 4 is provided on an upper surface of the top plate 41.

A work unit 8 is placed into each pair of accommodating sections 44 by a robot hand 2. The work unit 8 is formed by affixing a plate-shaped work 7 to an annular frame 5 to which an adhesive tape 6 is affixed. The spacing between each adjacent pairs of accommodating sections 44 in the z-axis direction (along the height) is such that the robot hand 2 holding the work unit 8 can be inserted into the spacing.

Figure 2:
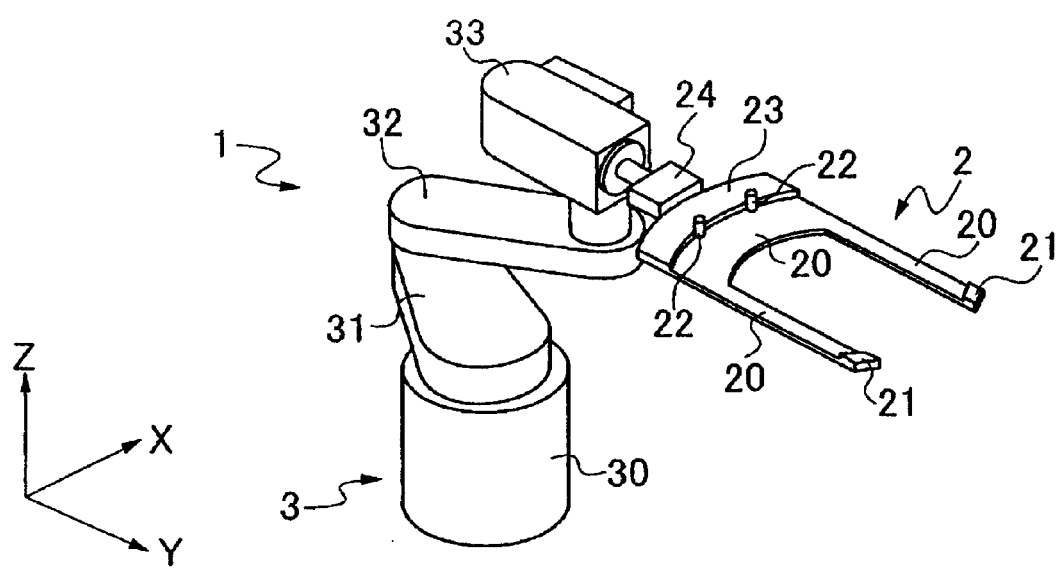
FIG. 2 is a perspective view illustrating a configuration of the robot hand.

A transporting robot 1 shown in FIG. 2 is equipped with the robot hand 2 to which the work unit 8 shown in FIG. 1 can be mounted. The same robot 1 includes the robot hand 2, moving means 3 and a fitting section 24. The work unit 8 shown in FIG. 1 is mounted to the robot hand 2. The moving means 3 loads the work unit 8, mounted to the robot hand 2, onto and unloads it from the cassette 4. The fitting section 24 fits the robot hand 2 to the moving means 3.

As illustrated in FIG. 2, the robot hand 2 includes a mounting surface 20 to which the work unit 8 is mounted. The same surface 20 is formed in such a manner that a tip side thereof branches into two parts. The mounting surface 20 is formed larger in diameter than the work unit 8 shown in FIG. 1. This makes it possible to mount the work unit 8 with some freedom of horizontal movement allowed for the work unit 8. The robot hand 2 has an anti-fall hook 21 at each tip portion of the mounting surface 20 that branches into two parts. Formed to have a surface more elevated than the mounting surface 20, each of the anti-fall hooks 21 supports a front edge portion 9a of the work unit 8 mounted to the mounting surface 20 and prevents the work unit 8 from falling off the mounting surface 20 as illustrated in FIG. 3.

Further, two support sections 22 are provided near the fitting section 24 of the robot hand 2 to support a rear edge portion 9b of the work unit 8. The two support sections 22 are formed to be cylindrical and, for example, several centimeters apart. If either of the support sections 22 comes into contact with the rear edge portion 9b of the work unit 8, the work unit 8 can be rotated on the mounting surface 20 about the contact point as a fulcrum. Further, a stepped portion 23 having a surface more elevated than the mounting surface 20 is formed near the two support sections 22.

The moving means 3 includes a support table 30, flexible arms 31 and 32, and a holding section 33. The arms 31 and 32 are provided in such a manner as to be able to move vertically and rotate relative to the support table 30. The holding section 33 is provided at one end of the arm 32. The robot hand 2 is connected to the holding section 33 in such a manner as to be able to rotate. The moving means 3 moves the robot hand 2 connected to the holding section 33 in response to the movement of the arms 31 and 32, thus allowing the robot hand 2 to be moved in x-, y- and z-axis directions.

Figure 3:
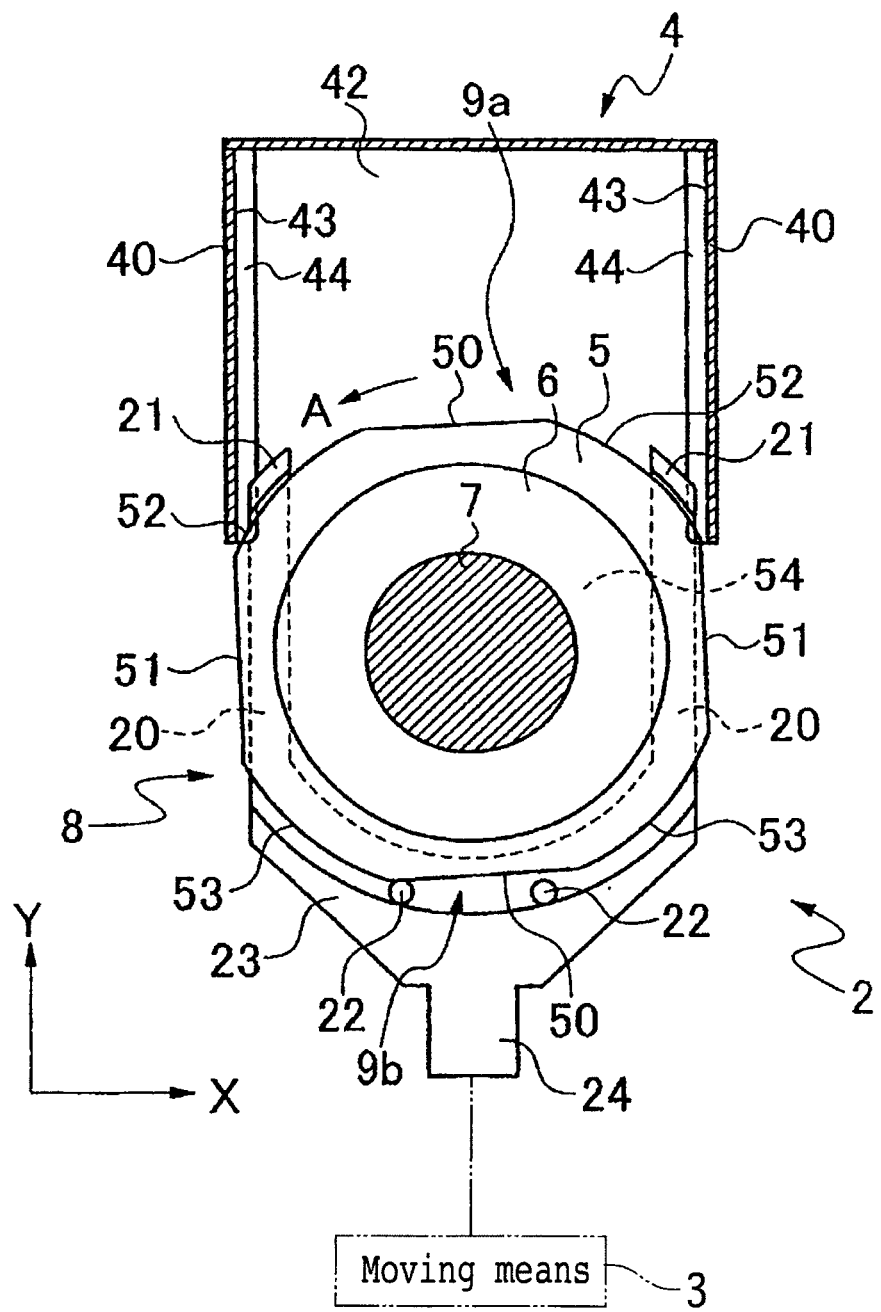
FIG. 3 is a sectional view illustrating that positioning surfaces for the work unit are in contact with inner walls of the cassette during placement of the work unit into the cassette.
Figure 4:
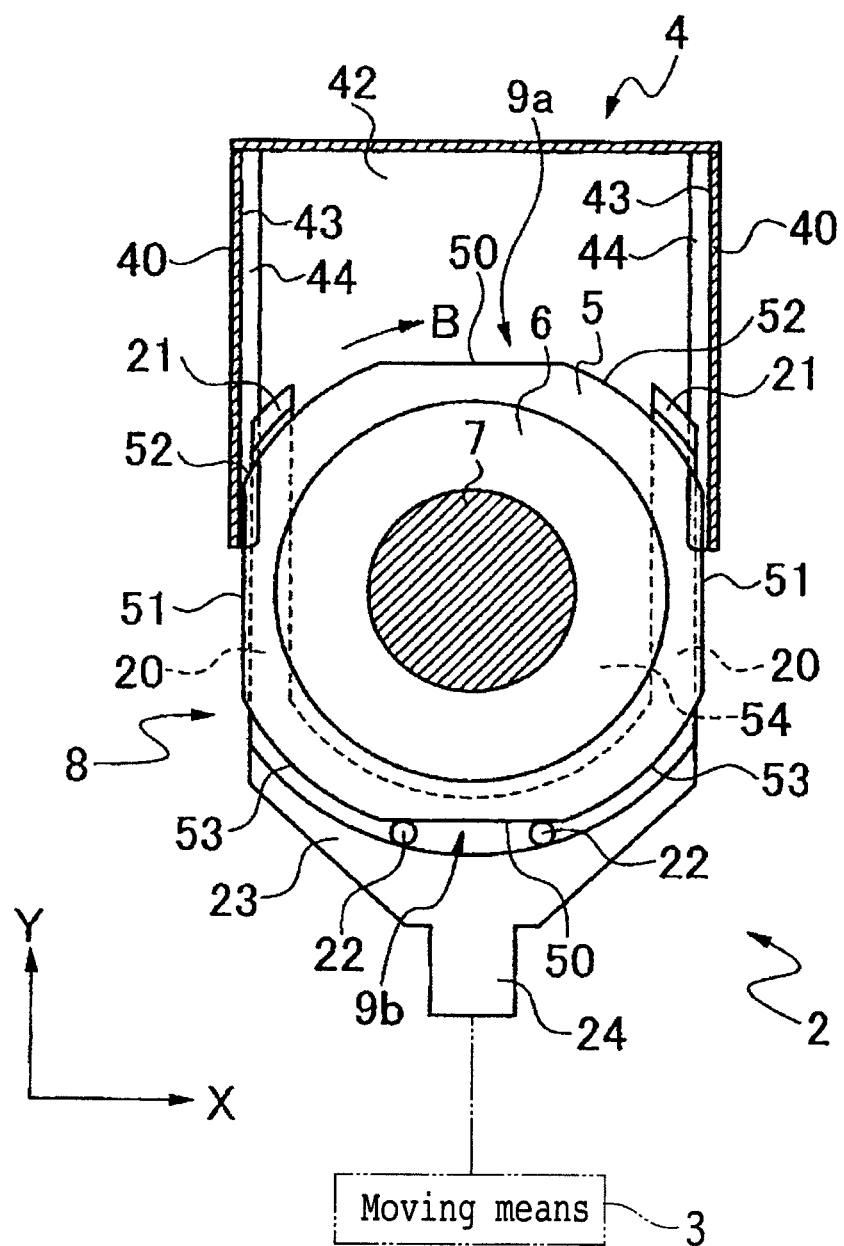
FIG. 4 is a sectional view illustrating that the work unit is placed into the cassette.
Figure 5:
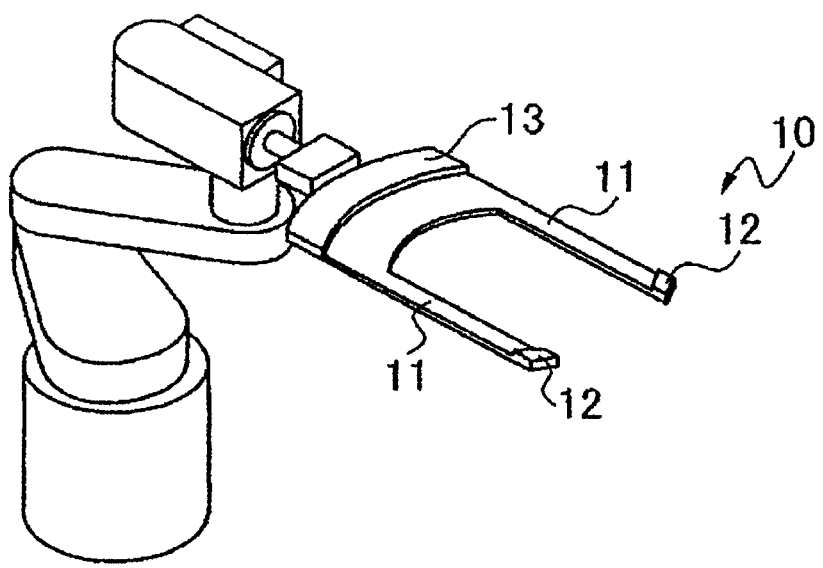
FIG. 5 is a perspective view illustrating a configuration of a conventional robot hand.

As illustrated in FIG. 3, the work unit 8 is formed with the annular frame 5, adhesive tape 6 and plate-shaped work 7 so that the annular frame 5, adhesive tape 6 and plate-shaped work 7 are integral with each other. An opening portion 54 is formed at the center of the annular frame 5. The adhesive tape 6 is affixed to one side of the annular frame 5. The plate-shaped work 7 is affixed to an area of the adhesive tape 6 adapted to block the opening portion 54. The annular frame 5 includes a pair of positioning surfaces 50 and a pair of positioning surfaces 51. The positioning surfaces 50 are formed by cutting out parts of a circularly formed outer perimeter of the annular frame 5 parallel to each other with the opening portion 54 sandwiched therebetween, and so are the positioning surfaces 51. In the example shown in FIG. 3, the positioning surfaces 50 and positioning surfaces 51 are orthogonal to each other. Further, arc-shaped outer perimeter portions 52 and 53 are formed, each between the positioning surfaces 50 and 51.

A description will be given next of an operation adapted to place the work unit 8 into the cassette 4 using the transporting robot 1. As illustrated in FIG. 1, the robot hand 2 mounts the work unit 8 to its mounting surface 20. Then, the moving means 3 shown in FIG. 2 moves the robot hand 2 close to the accommodating sections 44 of the cassette 4. Next, the moving means 3 moves the robot hand 2 in the y-axis direction, a direction of insertion of the robot hand 2, causing the work unit 8 to move in the same direction as illustrated in FIG. 3.

In order to place the work unit 8 into the cassette 4 as described above, it is necessary to ensure that the positioning surfaces 51 of the annular frame 5 are parallel to the inner walls 43 of the cassette 4. However, the work unit 8 mounted to the mounting surface 20 of the robot hand 2 may be misaligned in a direction of rotation of the same unit 8 about its center as a fulcrum as illustrated in FIG. 3. In the example shown in FIG. 3, the work unit 8 is misaligned in a direction of an arrow A, thus causing one of the outer perimeter portions 52 of the work unit 8 to protrude to a side of the cassette 4. Therefore, attempting to insert the misaligned work unit 8 into the cassette 4 results in the outer perimeter portion 52 of the annular frame 5 coming into contact with the inner wall 43 of the cassette 4, making it impossible to place the work unit 8 into the accommodating sections 44. It should be noted that the direction of misalignment of the work unit 8 is not limited to the direction of the arrow A. Instead, the work unit 8 may rotate in a direction opposite to the direction of the arrow A.

If an attempt is made to push the work unit 8 into the cassette 4 by moving the robot hand 2 forward after the outer perimeter portion 52 of the annular frame 5 have come into contact with the inner wall 43 of the cassette 4, an external force is exerted on the work unit 8 in a direction of travel of the moving means 3, thus causing the rear edge portion 9b of the misaligned work unit 8 mounted to the mounting surface 20 to be supported by one of the support sections 22 with the rear edge portion 9b in contact with the support section 22. It should be noted that if the work unit 8 is misaligned as a result of rotation in the opposite direction, the rear edge portion 9b of the work unit 8 is supported by the other support section 22. That is, it is possible to support the rear edge portion 9b of the work unit 8 with one of the support sections 22 in accordance with the direction of misalignment of the work unit 8.

If the work unit 8 is pushed further toward the cassette 4 when the rear edge portion 9b of the work unit 8 is supported by one of the support sections 22 with the rear edge portion 9b in contact with the support section 22 as illustrated in FIG. 3, the work unit 8 rotates on the mounting surface 20 in the direction opposite to the direction of misalignment, i.e., a direction of an arrow B, about a point of the rear edge portion 9b where the same portion 9b is supported by the support section 22 as a fulcrum. Then, the rear edge portion 9b rotates until the same portion 9b comes into contact with the other support section 22, thus allowing the orientation of the work unit 8 to be corrected. It should be noted that the positioning surfaces 50 and 51 of the annular frame 5 are orthogonal to each other. Therefore, if a straight line connecting the two support sections 22 is formed in the x-axis direction orthogonal to the y-axis direction, the direction of insertion of the robot hand 2, the orientation of the work unit 8 is corrected in such a manner that the positioning surfaces 50 face the x-axis direction. As a result, the positioning surfaces 51 automatically face the y-axis direction, thus bringing the same surfaces 51 parallel to the inner walls 43 of the cassette 4 and allowing the work unit 8 to be smoothly placed into the cassette 4.

Then, the moving means 3 inserts the robot hand 2 into the cassette 4, raising the work unit 8 above the accommodating sections 44 first, next lowering the robot hand 2, and finally placing the annular frame 5 making up the work unit 8 on the accommodating sections 44. The single work unit 8 is placed onto the accommodating sections 44 as described above.

Thus, in the event of exertion of an external force on the outer perimeter portion 52 of the work unit 8 in the direction of travel of the moving means 3 on the mounting surface 20 of the robot hand 2 when the robot hand 2 places the work unit 8, mounted to the mounting surface 20, into the cassette 4, it is possible to support the rear edge portion 9b of the work unit 8 with the support section 22 and, at the same time, rotate the work unit 8 on the mounting surface 20 about the point of the rear edge portion 9b where the same portion 9b is supported by the support section 22 as a fulcrum. This makes it possible to correct the misalignment of the work unit 8 on the mounting surface 20 of the robot hand 2.

In particular, if the two support sections 22 are provided as illustrated in the present embodiment, it is possible to support the rear edge portion 9b of the work unit 8 with one of the support sections 22 in accordance with the direction of misalignment of the work unit 8 and rotate the work unit 8. At the same time, one of the support sections 22 serves as a member adapted to determine the fulcrum of rotation of the work unit 8, and the other support section 22 as a positioning member adapted to limit the rotation, thus making it possible to positively correct the work unit 8 to a desired orientation.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A robot hand fitted to an arm of a robot for placing a work unit into a cassette, the work unit including an annular frame, an adhesive tape and a plate-shaped work, the annular frame having an opening portion, a pair of first positioning surfaces extending parallel to each other with the opening portion sandwiched therebetween, and a pair of second positioning surfaces extending parallel to each other in a direction orthogonal to the first positioning surfaces with the opening portion sandwiched therebetween, an outer perimeter portion of the adhesive tape being affixed to the annular frame, the plate-shaped work being affixed to the adhesive tape, the robot hand comprising:
a mounting surface to which the work unit is mounted with some freedom of horizontal movement allowed for the work unit;
a pair of anti-fall hooks each of which is formed at one edge portion of the mounting surface to support a front edge portion of the work unit mounted to the mounting surface so as to prevent the work unit from falling off the mounting surface; and
a pair of support sections each of which is provided at another edge portion of the mounting surface opposite to the anti-fall hooks to support a rear edge portion of the work unit,
wherein each of the support sections is cylindrical, and
further wherein if the annular frame collides with the cassette when the robot is activated to place the work unit, mounted to the mounting surface of the robot hand, into the cassette, the robot hand permits the rear edge portion of the work unit to come into contact with one of the cylindrical support sections so as to allow the work unit to be rotated on the mounting surface about the cylindrical support section in contact with the rear edge portion as a fulcrum and allow the work unit to be placed into the cassette.

2. A system for storing a work unit, wherein the work unit includes an annular frame, an adhesive tape and a plate-shaped work, the annular frame having an opening portion, a pair of first positioning surfaces extending parallel to each other with the opening portion sandwiched therebetween, and a pair of second positioning surfaces extending parallel to each other in a direction orthogonal to the first positioning surfaces with the opening portion sandwiched therebetween, an outer perimeter portion of the adhesive tape being affixed to the annular frame, the plate-shaped work being affixed to the adhesive tape, the system comprising:
a cassette configured to accommodate a plurality of the work units, the cassette including a pair of opposed inner walls supporting a plurality of aligned pairs of accommodating sections, wherein the aligned pairs of accommodating sections are spaced from adjacent aligned pairs of accommodating sections, and further wherein each of said aligned pairs of accommodating sections is configured and arranged to receive one of the work units;
a robot hand fitted to an arm of a robot for placing the work unit into the cassette, wherein, the robot hand comprises:
a mounting surface to which the work unit is mounted with some freedom of horizontal movement allowed for the work unit;
a pair of anti-fall hooks each of which is formed at one edge portion of the mounting surface to support a front edge portion of the work unit mounted to the mounting surface so as to prevent the work unit from falling off the mounting surface; and
a pair of support sections each of which is provided at another edge portion of the mounting surface opposite to the anti-fall hooks to support a rear edge portion of the work unit,
wherein each of the support sections is cylindrical, and
further wherein if the annular frame collides with the one of the inner walls of the cassette when the robot is activated to place the work unit, mounted to the mounting surface of the robot hand, upon one of the aligned pairs of accommodating sections within the cassette, contact with the inner wall causes the rear edge portion of the work unit to come into contact with one of the cylindrical support sections so that the work unit is rotated on the mounting surface about the cylindrical support section in contact with the rear edge portion as a fulcrum, thereby allowing the work unit to be placed into the cassette.

* * * * *